(12) United States Patent
Hara et al.

(10) Patent No.: US 10,326,106 B2
(45) Date of Patent: Jun. 18, 2019

(54) SEALING SHEET, MEMBER FOR ELECTRONIC DEVICES, AND ELECTRONIC DEVICE

(71) Applicant: LINTEC CORPORATION, Tokyo (JP)

(72) Inventors: Tsutomu Hara, Tokyo (JP); Takeshi Kondo, Tokyo (JP); Emi Fuchi, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 67 days.

(21) Appl. No.: 15/526,656

(22) PCT Filed: Nov. 14, 2014

(86) PCT No.: PCT/JP2014/080247
§ 371 (c)(1),
(2) Date: May 12, 2017

(87) PCT Pub. No.: WO2016/075824
PCT Pub. Date: May 19, 2016

(65) Prior Publication Data
US 2018/0261800 A1    Sep. 13, 2018

(51) Int. Cl.
*H01L 23/29*    (2006.01)
*H01L 51/52*    (2006.01)
(Continued)

(52) U.S. Cl.
CPC .......... *H01L 51/5253* (2013.01); *H01L 23/29* (2013.01); *H01L 23/293* (2013.01);
(Continued)

(58) Field of Classification Search
None
See application file for complete search history.

(56) References Cited

U.S. PATENT DOCUMENTS 6,112,477 A * 9/2000 Spinks .................. C09J 123/02
                                                          52/172
2002/0192872 A1* 12/2002 Fujisawa ............... H01L 21/565
                                                          438/123
(Continued)

FOREIGN PATENT DOCUMENTS

JP    2001-155623 A    6/2001
JP    2003-004916 A    1/2003
(Continued)

OTHER PUBLICATIONS

International Search Report (PCT/ISA/210) issued in PCT/JP2014/080247, dated Feb. 17, 2015.
(Continued)

*Primary Examiner* — Calvin Y Choi
(74) *Attorney, Agent, or Firm* — Birch, Stewart, Kolasch & Birch, LLP

(57) ABSTRACT

The present invention is a sealing sheet comprising at least a base resin layer and a sealing resin layer, the base resin layer having a microstructure that is provided to one surface of the base resin layer,
the sealing resin layer being provided on a side of the base resin layer on which the microstructure is provided, and
the microstructure having a protrusion that has a maximum difference in height (H) of 1 to 50 μm and is arranged two-dimensionally on the surface of the base resin layer, and
an electronic device member, and
an electronic device.
The sealing sheet according to the invention exhibits an excellent gas barrier capability that suppresses or reduces the entry of a gas (e.g., water vapor) not only in the vertical direction, but also in the horizontal direction (from the edge) with respect to the surface of the sealing sheet.

19 Claims, 5 Drawing Sheets

(51) Int. Cl.
*H01L 23/31* (2006.01)
*H05B 33/04* (2006.01)

(52) U.S. Cl.
CPC ............ *H01L 23/31* (2013.01); *H05B 33/04* (2013.01); *H01L 2924/0002* (2013.01)

(56) References Cited

U.S. PATENT DOCUMENTS

| | | | |
|---|---|---|---|
| 2003/0011315 A1 | 1/2003 | Ito et al. | |
| 2009/0026934 A1 | 1/2009 | Fujita et al. | |
| 2010/0062217 A1* | 3/2010 | Kurematsu | B29C 59/04 |
| | | | 428/141 |
| 2010/0308468 A1* | 12/2010 | Yoshikawa | H01L 23/3107 |
| | | | 257/773 |
| 2012/0228601 A1 | 9/2012 | Hiyama et al. | |
| 2013/0075707 A1 | 3/2013 | Harai | |
| 2014/0264310 A1* | 9/2014 | Hamatani | G02B 3/0025 |
| | | | 257/40 |

FOREIGN PATENT DOCUMENTS

| | | |
|---|---|---|
| JP | 2003-059645 A | 2/2003 |
| JP | 2005-279807 A | 10/2005 |
| JP | 2006-100137 A | 4/2006 |
| JP | 2008-083148 A | 4/2008 |
| JP | 2009-524705 A | 7/2009 |
| JP | 2012-057065 A | 3/2012 |
| JP | 2013-073821 A | 4/2013 |

OTHER PUBLICATIONS

Written Opinion (PCT/ISA/237) issued in PCT/JP2014/080247, dated Feb. 17, 2015.
European Search Report for European Application No. 14905807.5, dated May 2, 2018.

* cited by examiner (a)

(b)

(c)

(d)

(e)

(a)  (b)

(c)  (d)

(a)

(b)

(c)

SEALING SHEET, MEMBER FOR ELECTRONIC DEVICES, AND ELECTRONIC DEVICE

TECHNICAL FIELD

The present invention relates to a sealing sheet that exhibits an excellent gas barrier capability, an electronic device member, and an electronic device.

BACKGROUND ART

In recent years, an organic EL element that can achieves high-brightness emission by means of low-voltage DC drive has attracted attention as an emitting element that is used for a liquid crystal display and an electroluminescence (EL) display. It has been studied to use a transparent plastic film as an electrode substrate that is used for these displays in order to implement a reduction in thickness, a reduction in weight, an increase in flexibility, and the like.

An organic EL element deteriorates in emission properties (e.g., emission brightness, emission efficiency, and emission uniformity) when driven for a certain period of time. It is considered that such a problem occurs since the electrode, the organic layer (emitting layer), and the like included in the organic EL element deteriorate with the passing of time due to water vapor that has entered the organic EL element, and a non-emitting area occurs, for example. Various types of organic EL element sealing technology have been proposed to prevent the entry of water vapor into the organic EL element.

For example, Patent Literature 1 and 2 disclose a sealing method that uses a flexible film for an organic EL element.

According to the methods disclosed in Patent Literature 1 and 2, however, it is difficult to sufficiently suppress the entry of water vapor into the organic EL element, prevent deterioration in the organic EL element, and reliably and easily seal the organic EL element.

Therefore, development of a sealing sheet that exhibits an excellent gas (e.g., water vapor) barrier capability has been strongly desired.

CITATION LIST

Patent Literature

Patent Literature 1: JP-A-2003-059645
Patent Literature 2: JP-T-2009-524705

SUMMARY OF INVENTION

Technical Problem

The invention was conceived in view of the above situation. An object of the invention is to provide a sealing sheet that exhibits an excellent gas barrier capability, an electronic device member, and an electronic device.

Solution to Problem

The inventors conducted extensive studies with regard to a sealing sheet that includes a base resin layer and a sealing resin layer in order to solve the above technical problem. As a result, the inventors found that a sealing sheet wherein the base resin layer has a microstructure that is provided to one surface of the base resin layer, the sealing resin layer is provided on the side of the base resin layer on which the microstructure is provided, and the microstructure has a protrusion that has a maximum difference in height (H) of 1 to 50 μm and is arranged two-dimensionally on the surface of the base resin layer, exhibits an excellent gas barrier capability. This finding has led to the completion of the invention.

Several aspects of the invention provide the following sealing sheet (see (1) to (17)), electronic device member (see (18)), and electronic device (see (19)).

(1) A sealing sheet including at least a base resin layer and a sealing resin layer, the base resin layer having a microstructure that is provided to one surface of the base resin layer,
the sealing resin layer being provided on the side of the base resin layer on which the microstructure is provided, and
the microstructure having a protrusion that has a maximum difference in height (H) of 1 to 50 μm and is arranged two-dimensionally on the surface of the base resin layer.
(2) The sealing sheet according to (1), wherein the ratio (h/H) of the thickness (h) of the sealing resin layer to the maximum difference in height (H) of the microstructure is 1.0 or more and less than 3.0.
(3) The sealing sheet according to (1), wherein the thickness (h) of the sealing resin layer is 1.0 to 100 μm.
(4) The sealing sheet according to (1), wherein the microstructure has (i) a configuration in which a plurality of the protrusions are arranged on the surface of the base resin layer either regularly or irregularly at a nanometer pitch, (ii) a configuration in which the protrusion that is formed in the shape of a rail is arranged on the surface of the base resin layer either regularly or irregularly, or (iii) a combination thereof.
(5) The sealing sheet according to (4), wherein the protrusion has a shape selected from a pyramidal shape, a conical shape, and a tapered shape.
(6) The sealing sheet according to (4), wherein the microstructure has a configuration in which the protrusion that is formed in the shape of a rail is provided at least at the edge of the surface of the base resin layer.
(7) The sealing sheet according to (4), wherein the microstructure has a configuration in which the protrusion that is formed in the shape of a rail is two-dimensionally arranged on the surface of the base resin layer so as to have a circular shape, a spiral shape, a rectangular shape, a rounded rectangular shape, a grid-like shape, an orthogonal-oblique grid-like shape, or a wavy grid-like shape.
(8) The sheet-like sealing material according to (1), wherein the protrusion has a quadrangular, triangular, or semicircular cross-sectional shape.
(9) The sealing sheet according to (1), wherein the microstructure is formed by embossing.
(10) The sealing sheet according to (1), wherein the sealing resin layer is a layer formed using a sealing resin composition that includes a rubber-based resin.
(11) The sealing sheet according to (10), wherein the rubber-based resin is a polyisobutylene-based resin.
(12) The sealing sheet according to (1), wherein the sealing resin layer is a layer formed using a sealing resin composition that includes a rubber-based resin and a tackifier.
(13) The sealing sheet according to (1), wherein the sealing resin layer is formed contiguous to the base resin layer.
(14) The sealing sheet according to (1), further including a gas barrier layer.
(15) The sealing sheet according to (14), the sealing sheet being a laminate in which the gas barrier layer, the base resin layer, and the sealing resin layer are stacked in this order.

(16) The sealing sheet according to (15), wherein the water vapor transmission rate of the base resin layer measured at a temperature of 40° C. and a relative humidity of 90% is lower than that of the sealing resin layer.
(17) The sealing sheet according to (14), the sealing sheet being a laminate in which the base resin layer, the gas barrier layer, and the sealing resin layer are stacked in this order.
(18) An electronic device member including the sealing sheet according to any one of (1) to (17).
(19) An electronic device including the electronic device member according to (18).

Advantageous Effects of Invention

The sealing sheet according to one aspect of the invention exhibits an excellent gas barrier capability that suppresses or reduces the entry of a gas (e.g., water vapor) not only in the vertical direction, but also in the horizontal direction (from the edge) with respect to the surface of the sealing sheet.

The electronic device member according to one aspect of the invention and the electronic device according to one aspect of the invention include the sealing sheet according to one aspect of the invention, and exhibit an excellent sealing capability.

DESCRIPTION OF EMBODIMENTS

Figure 1:
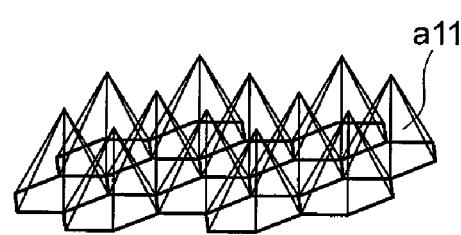
FIG. 1 is a view illustrating an example of a microstructure (i) that is provided to a base resin layer.
Figure 1:
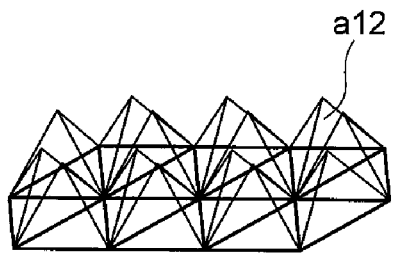
Figure 1:
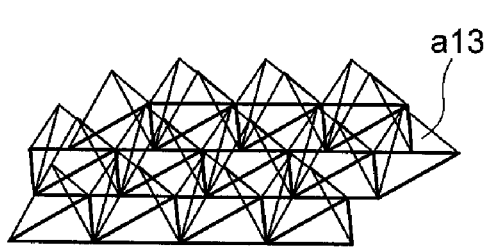
Figure 1:
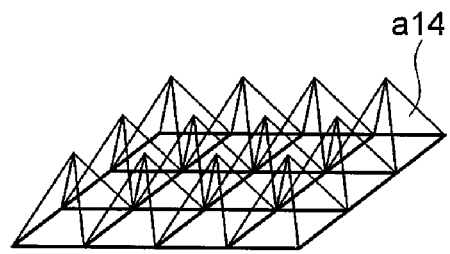
Figure 1:
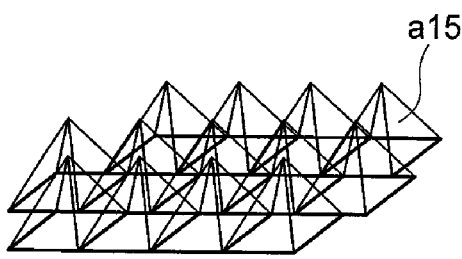

A sealing sheet, an electronic device member, and an electronic device according to the exemplary embodiments of the invention are described in detail below.
1) Sealing Sheet
A sealing sheet according to one embodiment of the invention includes at least a base resin layer and a sealing resin layer, the base resin layer having a microstructure that is provided to one surface of the base resin layer, the sealing resin layer being provided on the side of the base resin layer on which the microstructure is provided, and the microstructure having a protrusion that has a maximum difference in height (H) of 1 to 50 µm and is arranged two-dimensionally on the surface of the base resin layer.

The term "sheet" used herein includes a strip-like sheet and a long (belt-like) sheet.

(1) Base Resin Layer
The base resin layer included in the sealing sheet according to one embodiment of the invention has the microstructure that is provided to one surface of the base resin layer.

It is possible to suppress or reduce the entry of a gas (e.g., water vapor and oxygen) from the edge of a layer that is contiguous to the base resin layer, by utilizing the base resin layer that has the microstructure that is provided to the surface of the base resin layer, and obtain a sealing sheet that exhibits an excellent gas barrier capability.

The resin that is used to form the base resin layer is not particularly limited as long as the microstructure can be formed on one surface of the base resin layer.

Examples of the resin that is used to form the base resin layer include a thermoplastic resin; a thermosetting resin such as an epoxy resin, a silicone resin, and a phenol resin; a photocurable resin such as a photocurable acrylic resin, a photocurable urethane resin, and a photocurable epoxy resin; and the like. These resins may be used either alone or in combination.

It is preferable to use a thermoplastic resin from the viewpoint of ease of production and the like. Examples of the thermoplastic resin include a polyolefin resin such as polyethylene, polypropylene, polystyrene, polymethylpentene, and a cycloolefin-based copolymer; a polyamide resin such as an alicyclic polyolefin resin, nylon 6, and nylon 66; an aramid resin; a polyester resin such as polyethylene terephthalate, polybutylene terephthalate, polypropylene terephthalate, polybutyl succinate, and polyethylene 2,6-naphthalate; a polycarbonate resin; a polyarylate resin; a polyacetal resin; a polyphenylene sulfide resin; a fluororesin such as
a polytetrafluoroethylene resin and a polyvinylidene fluoride resin; an acrylic resin;
a methacrylic resin; a polyacetal resin; a polyglycolic acid resin; a polyimide resin;
a polyamide-imide resin; a polylactic acid resin; and the like.

A base film that is formed of one resin or two or more resins among the above resins may be used as the base resin layer. A laminate film that includes two or more base films that may differ in type may also be used as the base resin layer.
Microstructure
The base resin layer included in the sealing sheet according to one embodiment of the invention has the microstructure that is provided to one surface of the base resin layer.

The term "microstructure" used herein refers to a structure having a protrusion(s) having a maximum difference in height (H) of 1 to 50 µm (preferably 5 to 40 µm) and arranged two-dimensionally on the surface of the base resin layer.

If the maximum difference in height (H) of the protrusion(s) is 50 µm or more, an increase in haze may occur, and sufficient optical properties may not be obtained when an organic EL device or the like is sealed using the sealing sheet. If the maximum difference in height (H) of the protrusion(s) is less than 1 µm, it may be difficult to suppress the entry of a gas (e.g., water vapor) from the edge of the sealing resin layer (i.e., it may be difficult to obtain the advantageous effects of the invention).

The term "maximum difference in height (H)" used herein refers to the difference in height between the lowest part (position) of the surface of the base resin layer and the highest part (position) of the protrusion(s) of the microstructure.

The expression "protrusion(s) is (are) arranged two-dimensionally on the surface of the base resin layer" used herein means that the protrusion(s) is (are) formed on the surface of the base resin layer either regularly (continuously or successively) or irregularly.

The two-dimensional arrangement of the protrusion(s) is not particularly limited. Examples of the two-dimensional arrangement of the protrusion(s) include (i) a configuration in which a plurality of protrusions are arranged either regularly or irregularly (microstructure (i)), (ii) a configuration in which a protrusion that is formed in the shape of a rail is arranged either regularly or irregularly (microstructure (ii)), (iii) a combination thereof (microstructure (iii)), and the like.

Microstructure (i)

The three-dimensional shape of the protrusion(s) forming the microstructure (i) is not particularly limited. Examples of the three-dimensional shape of the protrusion(s) include a pyramidal shape such as a triangular pyramidal shape, a quadrangular pyramidal shape, a pentagonal pyramidal shape, and a hexagonal pyramidal shape; a conical shape; a truncated pyramid such as a triangular truncated pyramidal shape, a quadrangular truncated pyramidal shape, a pentagonal truncated pyramidal shape, and a hexagonal truncated pyramidal shape; a truncated conical shape; a tapered shape; a cylindrical shape; a polygonal prism shape; and the like.

Examples of the microstructure (i) include a microstructure in which protrusions (a11) having a hexagonal pyramidal shape are arranged regularly (see (a) in FIG. 1), a microstructure in which protrusions (a12) having a triangular pyramidal shape are arranged regularly (see (b), (c) in FIG. 1), a microstructure in which protrusions (a13) having a quadrangular pyramidal shape are arranged continuously and regularly (see (d), (e) in FIG. 1), a microstructure in which protrusions (a13) having a pyramidal shape are arranged at intervals either intermittently or irregularly (not illustrated in the drawings), and the like.

The pitch of the microstructure (i) may be appropriately determined taking account of the application of the sealing sheet and the like, but is normally 1 to 300 µm, and preferably 5 to 50 µm.

Microstructure (ii)

The three-dimensional shape of the protrusion that forms the microstructure (ii) and is formed in the shape of a rail (hereinafter may be referred to as "rail-shaped protrusion") is not particularly limited. For example, (ii-1) the rail-shaped protrusion may be provided on the surface of the base resin layer so as to have a circular shape, a spiral shape, a rectangular shape, or a rounded rectangular shape, or (ii-2) the rail-shaped protrusion may be two-dimensionally provided on the surface of the base resin layer in the shape of a grid (mesh), an orthogonal-oblique grid, or a wavy grid.

Figure 2:
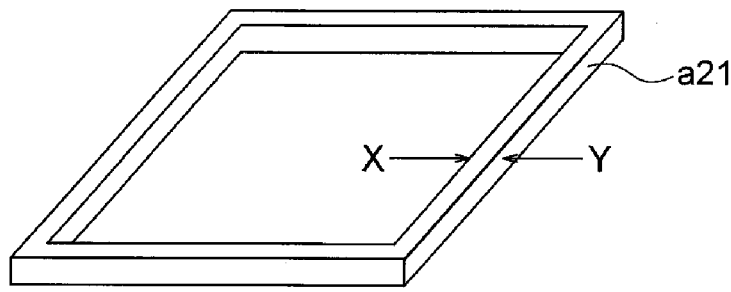
FIG. 2 is a view illustrating an example of a microstructure (ii) that is provided to a base resin layer.
Figure 3:
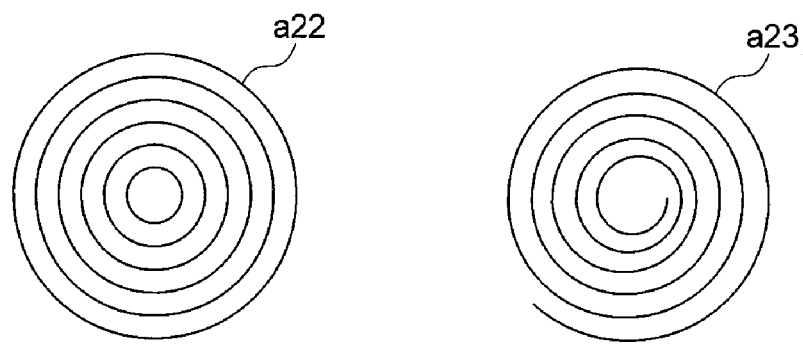
FIG. 3 is a view illustrating an example of a microstructure (ii) that is provided to a base resin layer.
Figure 3:
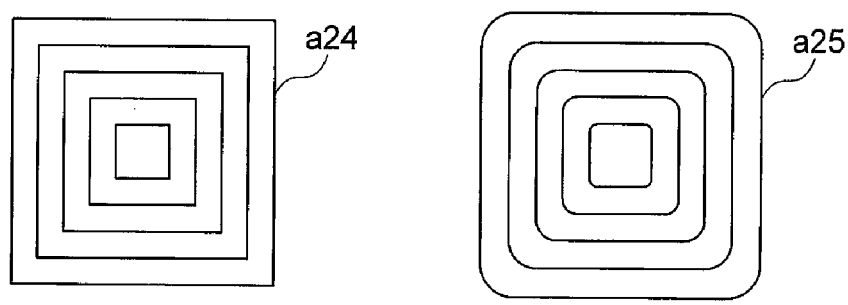

Specific examples of the microstructure (ii-1) include a microstructure in which a rail-shaped protrusion (a21) is provided along the edge of the surface of the base resin layer (see FIG. 2), a microstructure in which circular rail-shaped protrusions (a22) are provided over the entire surface of the base resin layer (see (a) in FIG. 3), a microstructure in which a rail-shaped protrusion (a23) is spirally provided over the entire surface of the base resin layer (see (b) in FIG. 3), a microstructure in which rectangular rail-shaped protrusions (a24) are provided over the entire surface of the base resin layer (see (c) in FIG. 3), a microstructure in which rounded rectangular rail-shaped protrusions (a25) are provided over the entire surface of the base resin layer (see (d) in FIG. 3), and the like.

Figure 4:
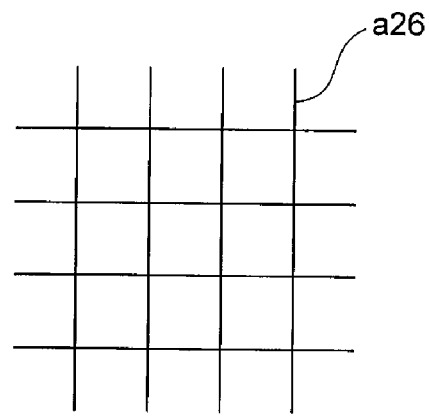
FIG. 4 is a view illustrating an example of a microstructure (ii) that is provided to a base resin layer.
Figure 4:
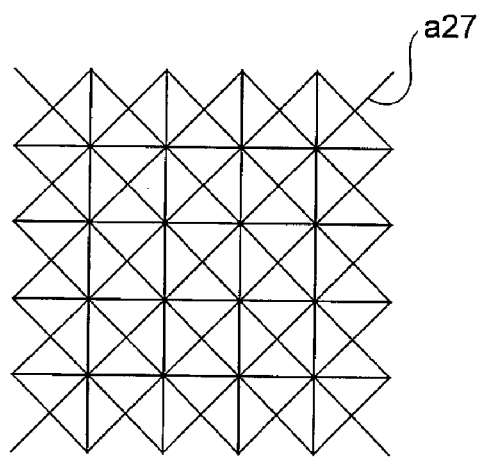
Figure 4:
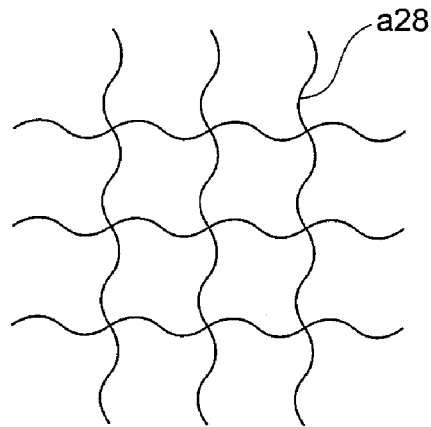
Figure 5:
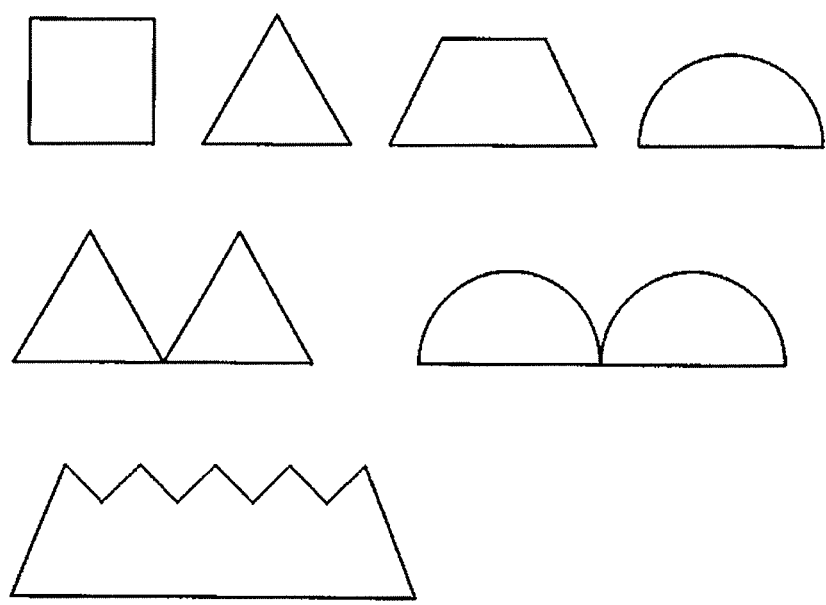
FIG. 5 is a view illustrating an example of the cross-sectional shape of a microstructure (ii) that is provided to a base resin layer.

Specific examples of the microstructure (ii-2) include a microstructure in which rail-shaped protrusions (a26) are provided over the entire surface of the base resin layer in the shape of a grid (see (a) in FIG. 4), a microstructure in which rail-shaped protrusions (a27) are provided over the entire surface of the base resin layer in the shape of an orthogonal-oblique grid (see (b) in FIG. 4), a microstructure in which rail-shaped protrusions (a28) are provided over the entire surface of the base resin layer in the shape of a wavy grid (see (c) in FIG. 4), and the like.

The microstructure (ii-2) may have a configuration in which rail-shaped protrusions are arranged either intermittently or irregularly. Note that the microstructure (ii) is not limited to the microstructures mentioned above.

The shape of the cross section of the rail-shaped protrusion in the direction (X-Y-direction in FIG. 2) perpendicular to the longitudinal direction is not particularly limited. Examples of the shape of the cross section of the rail-shaped protrusion in the direction perpendicular to the longitudinal direction include a polygonal shape such as a quadrangular shape and a triangular shape; a curved shape such as a semicircular shape and an elliptical shape; a combination thereof; and the like.

Microstructure (iii)

Examples of the microstructure (iii) include a microstructure in which a rail-shaped protrusion and a protrusion having a pyramidal shape or the like are arranged either regularly or irregularly, and the like.

It is preferable that the microstructure be provided (formed) at least at the edge of the surface of the base resin layer from the viewpoint of preventing the entry of a gas (e.g., water vapor) from the edge of the sealing sheet to obtain a better gas barrier capability. A dense microstructure (i.e., a microstructure in which a protrusion(s) is (are) formed densely) is preferable as compared with a thin microstructure.

The surface of the base resin layer may form the microstructure, or a resin layer having the microstructure may be stacked on the surface of the base resin layer.

The microstructure may be formed on the surface of the base resin layer using an arbitrary method. The microstructure may be formed on the surface of the base resin layer using a known method. For example, the microstructure may be formed on the surface of the base resin layer using an embossing method (e.g., nanoimprint method); a 3D printing method; a sandblasting method; a method that utilizes a particle mask (see JP-A-2001-155623 and JP-A-2005-279807, for example); a method that utilizes a hologram/lithography; a method that utilizes an electron beam drawing technique or a laser drawing technique (see JP-A-2003-4916, for example); a method that utilizes a plasma processing technique; or the like.

The resin layer having the microstructure may be stacked on the surface of the base resin layer using a printing method (e.g., offset printing method, flexographic printing method, gravure printing method, screen printing method, ink-jet printing method, or sublimation transfer method); a method that applies a microstructure-forming solution prepared by dissolving a thermoplastic resin in an organic solvent in a specific pattern using a known application method (e.g., brush coating method, roll coating method, spray coating method, dip coating method, flow coater coating method, or roll coater coating method), and dries the resulting film; an electrodeposition coating method; or the like.

It is preferable to use an embossing method from the viewpoint of productivity.

An embossing method that utilizes a nanoimprint method may be implemented as described below, for example. The base resin layer that is provided to the surface of an appropriate support is heated while pressing a nanoimprint mold against the base resin layer so that the resin that forms the base resin layer and has been softened enters the fine space formed in the nanoimprint mold. A nanoimprint mold having an arbitrary form (e.g., planar form, belt-like form, or roll belt-like form) may be selectively used as the nanoimprint mold. After cooling the resin, the nanoimprint mold is removed to obtain a base resin layer onto which the microstructure formed on the nanoimprint mold has been transferred.

The thickness of the base resin layer is selected taking account of the shape of the protrusion(s) of the microstructure, and the like, but is normally 1 to 300 µm, and preferably 1 to 100 µm. Note that the thickness of the base resin layer is equal to or greater than the maximum height of the protrusion(s).

The water vapor transmission rate of the base resin layer measured at a temperature of 40° C. and a relative humidity of 90% is preferably lower than 50 g/(m²·day), more preferably lower than 30 g/(m²·day), and still more preferably lower than 20 g/(m²·day).

When the water vapor transmission rate of the base resin layer is higher than 0.01 g/(m²·day), the water vapor transmission rate of the base resin layer may be measured using the humidity detection sensor method (Lyssy method) or the infrared detection sensor method (MOCON method) specified in JIS K 7129. When the water vapor transmission rate of the base resin layer is equal to or lower than 0.01 g/(m²·day), the water vapor transmission rate of the base resin layer may be measured using the Ca method or the API-MASS method specified in JIS K 7129. The water vapor transmission rate of the base resin layer was measured in the examples using a method appropriately selected from the above methods.

(2) Sealing Resin Layer

The sealing sheet according to one embodiment of the invention includes the sealing resin layer that includes a sealing resin.

The resin that is used to form the sealing resin layer is not particularly limited. Examples of the resin that is used to form the sealing resin layer include a rubber-based resin, a styrene-based thermoplastic elastomer, a (meth)acrylic-based resin, a polyolefin-based resin, a polyester-based resin, a silicone-based resin, a urethane-based resin, and the like. It is preferable to use a rubber-based resin since a rubber-based resin has a low water vapor transmission rate.

A synthetic rubber (e.g., polyisobutylene-based resin and polybutene-based resin) and a natural rubber may be used as the rubber-based resin. It is preferable to use a polyisobutylene-based resin since a polyisobutylene-based resin exhibits a better gas barrier capability.

Examples of the polyisobutylene-based resin include polyisobutylene (isobutylene homopolymer), a copolymer of isobutylene and isoprene, a copolymer of isobutylene and n-butene, a copolymer of isobutylene and butadiene, halogenated copolymers obtained by brominating or chlorinating these copolymers, and the like. When the polyisobutylene-based resin is a copolymer, the polyisobutylene-based resin is characterized in that the content of a structural unit derived from isobutylene is higher than the content of a structural unit derived from a monomer other than isobutylene. Polyisobutylene (isobutylene homopolymer) and a copolymer of isobutylene and isoprene are preferable as the polyisobutylene-based resin.

The content of the sealing resin in the sealing resin layer is normally 60 to 100 mass %, and preferably 70 to 100 mass %.

The weight average molecular weight of the sealing resin is normally 50,000 to 1,000,000, preferably 100,000 to 500,000, and more preferably 300,000 to 450,000, from the viewpoint of decreasing the water vapor transmission rate, improving the cohesive strength, and preventing contamination of the adherend. If the weight average molecular weight of the sealing resin is less than the above range, the resulting sealing resin layer may exhibit insufficient cohesive strength, and the adherend may be contaminated. If the weight average molecular weight of the sealing resin exceeds the above range, the sealing resin may exhibit low flexibility and fluidity, and exhibit insufficient wettability with the adherend. Moreover, the sealing resin may exhibit decreased solubility in a solvent when forming the sealing resin layer.

Note that the term "weight average molecular weight" used herein refers to a polystyrene-equivalent weight average molecular weight determined by gel permeation chromatography (GPC) (hereinafter the same).

The sealing resin layer is formed using a sealing resin composition as described later. The sealing resin composition may include a tackifier in addition to the sealing resin so that the sealing resin composition exhibits improved adhesion.

The tackifier is not particularly limited. Examples of the tackifier include a natural resin-based tackifier and a synthetic resin-based tackifier that are known in the art.

Examples of the natural resin-based tackifier include a rosin-based resin, a terpene-based resin, and the like. Examples of the rosin-based resin include a rosin such as gum rosin, tall rosin, and wood rosin; a modified rosin such as a hydrogenated rosin, a disproportionated rosin, and a polymerized rosin; a rosin ester such as a glycerol ester of a modified rosin, and a pentaerythritol ester of a modified rosin; and the like. Examples of the terpene-based resin include an α-pinene-based terpene resin, a β-pinene-based terpene resin, a dipentene (limonene)-based terpene resin, an aromatic-modified terpene resin, a hydrogenated terpene resin, a terpene phenol resin, and the like.

Examples of the synthetic resin-based tackifier include a polymer-based tackifier such as petroleum resins (e.g., aliphatic (C5) petroleum resin, aromatic (C9) petroleum resin, copolymer (C5-C9) petroleum resin, hydrogenated petroleum resin, and alicyclic petroleum resin), a cumarone-indene resin, and a pure monomer-based petroleum resin (e.g., styrene-based petroleum resin and substituted styrene-based petroleum resin), and a fused-type tackifier such as a phenol resin (e.g., alkylphenol resin and rosin-modified phenol resin) and a xylene resin.

These tackifiers may be used either alone or in combination. Among these, a petroleum resin is preferable, and an aliphatic (C5) petroleum resin is more preferable.

The content of the tackifier in the sealing resin layer is normally 0 to 30 mass %, and preferably 10 to 30 mass %.

The sealing resin composition may further include an additional component.

Examples of the additional component include a cross-linking agent, a light stabilizer, an antioxidant, a softener, a thermal stabilizer, a UV absorber, a filler, a plasticizer, and the like. Each additional component may be used in an appropriate amount taking account of the properties of each additional component, and the properties required for the desired sealing sheet, as long as the object of the invention is not impaired.

The sealing resin composition may be obtained by mixing the resin and an optional additional component in a specific ratio, and mixing and defoaming the mixture using a known method.

A solvent may be added to the sealing resin composition in order to adjust the solid content in the sealing resin composition. The solid content in the resulting solution is preferably 10 to 35 mass %.

The solvent is not particularly limited as long as the solvent has compatibility with a moisture absorbent and a sealing material. Examples of the solvent include aliphatic hydrocarbons such as n-hexane and cyclohexane; aromatic hydrocarbons such as benzene, toluene, and xylene; halides thereof; esters such as ethyl acetate and butyl acetate; ketones such as methyl ethyl ketone and cyclohexanone; amides such as dimethylformamide; and the like. These solvents may be used either alone or in combination.

The sealing resin layer may be formed by applying the sealing resin composition obtained as described above to a base using a known application (coating) method, and drying the resulting film.

The base is not particularly limited. Examples of the base include the base resin layer, a laminate that includes a gas barrier layer (described later) and the base resin layer, a release sheet, and the like. It is preferable to use a release sheet as the base from the viewpoint of efficiently producing the sealing sheet.

When a release sheet is used as the base, the sealing resin layer is formed by applying the sealing material composition (solution) to the release surface of the release sheet, and drying the resulting film.

The release sheet includes a release sheet base that has a release surface. The release sheet base is not particularly limited. Examples of the release sheet base include a base resin layer that is formed of polyethylene terephthalate, polyethylene, polypropylene, polybutene, polybutadiene, polymethylpentene, polyvinyl chloride, a vinyl chloride copolymer, polybutylene terephthalate, polyurethane, an ethylene-vinyl acetate copolymer, an ionomer resin, an ethylene-(meth)acrylic acid copolymer, polystyrene, a polycarbonate, a fluororesin, low-density polyethylene, linear low-density polyethylene, triacetyl cellulose or the like; and paper such as high-quality paper, coated paper, glassine paper, and laminated paper.

The thickness of the release sheet base is normally 5 to 200 μm, and preferably 10 to 100 μm, from the viewpoint of handling capability.

The release sheet base may be provided with a release surface by applying a release agent (e.g., fluorine-based resin, silicone-based resin, or long-chain alkyl group-containing carbamate) to the surface of the release sheet base to form a release layer.

A commercially-available product may be used directly as the release sheet.

The sealing material composition (solution) may be applied to the release layer of the release sheet using a known method (e.g., spin coating method, spray coating method, bar coating method, knife coating method, roll coating method, blade coating method, die coating method, or gravure coating method).

After applying the sealing material composition to the release sheet (base), it is preferable to heat (dry) the resulting film at 80 to 150° C. for 30 seconds to 5 minutes in order to prevent a situation in which the solvent and a low-boiling-point component remain in the film.

A sealing resin layer provided with a release sheet can thus be obtained.

When the base resin layer, or a laminate that includes the gas barrier layer (described later) and the base resin layer, is used as the base, the sealing resin layer is formed by applying the sealing material composition (solution) to the surface of the base resin layer or the laminate, and drying the resulting film in the same manner as described above.

The thickness (h) of the sealing resin layer is normally 1.0 to 100 μm, preferably 3.0 to 60 μm, and more preferably 5.0 to 50 μm.

When the thickness (h) of the sealing resin layer is 1.0 μm or more, the sealing resin layer exhibits excellent adhesion to the adherend. When the thickness (h) of the sealing resin layer is 100 μm or less, it is advantageous from the viewpoint of productivity, and it is possible to obtain a sealing sheet that exhibits an excellent handling capability.

The thickness (h) of the sealing resin layer is preferably selected so that the ratio (h/H) of the thickness (h) of the sealing resin layer to the maximum difference in height (H) of the microstructure that is provided to the surface of the base resin layer is 1.0 or more and less than 3.0, more preferably 1.0 or more and less than 2.0, and particularly preferably 1.0 or more and less than 1.5.

If the ratio (h/H) is less than 1.0, the sealing resin layer may exhibit decreased adhesion to the adherend due to a decrease in the area of contact with the adherend. If the ratio (h/H) is 3.0 or more, it may be difficult to prevent the entry of a gas or water from the edge of the sealing resin layer.

Figure 6:
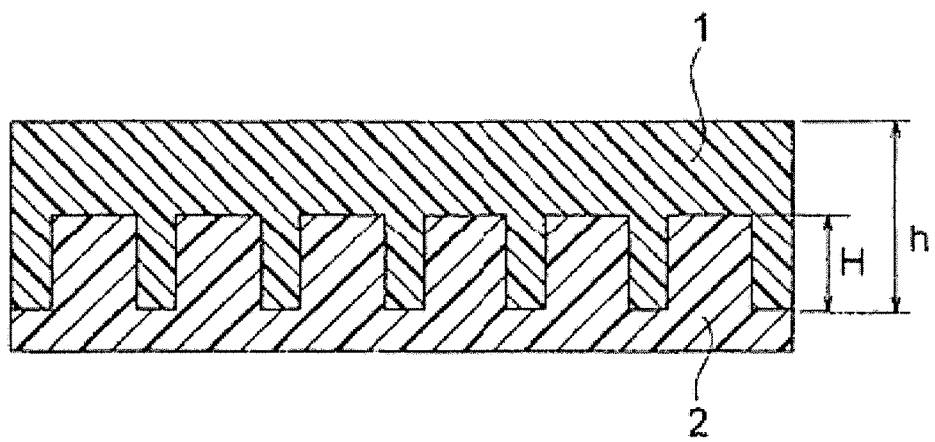
FIG. 6 is a view illustrating the thickness (h) of a sealing resin layer, and the maximum difference in height (H) of a microstructure.

Note that the thickness (h) and the maximum difference in height (H) are illustrated in FIG. 6.

The water vapor transmission rate of the sealing resin layer measured at a temperature of 40° C. and a relative humidity of 90% is preferably 100 g/(m²·day), more preferably 50 g/(m²·day), and still more preferably 30 g/(m²·day).

The water vapor transmission rate of the sealing resin layer may be measured using the method described above.

(3) Gas Barrier Layer

It is preferable that the sealing sheet according to one embodiment of the invention further include a gas barrier layer.

The gas barrier layer that may be included in the sealing sheet according to one embodiment of the invention is a layer that exhibits a capability to suppress or reduce transmission (penetration) of oxygen and water vapor (hereinafter may be referred to as "gas barrier capability"). When the sealing sheet includes the gas barrier layer, the sealing sheet exhibits a better gas barrier capability.

The gas barrier layer is not particularly limited. A known gas barrier layer that is used for a sealing sheet may be used as the gas barrier layer.

Examples of a material that is used to form the gas barrier layer include a silicon compound such as a polysilazane compound, a polycarbosilane compound, a polysilane compound, a polyorganosiloxane compound, and a tetraorganosilane compound; an inorganic oxide such as silicon oxide, silicon oxynitride, aluminum oxide, aluminum oxynitride, magnesium oxide, zinc oxide, indium oxide, tin oxide, and zirconium oxide; an inorganic nitride such as silicon nitride and aluminum nitride; an inorganic oxynitride such as silicon oxynitride; a metal such as aluminum, magnesium, zinc, and tin; and the like. These materials may be used either alone or in combination. When two or more materials are used in combination, the two or more materials may be dispersed uniformly, or may be used so that the composition changes gradually.

The gas barrier layer may be formed using a method that is appropriately selected taking account of the type of material. For example, the gas barrier layer may be formed using a method that forms a layer of the above material on the base resin layer using a deposition method, a sputtering method, an ion plating method, a thermal CVD method, a plasma CVD method, or the like; a method that applies a solution prepared by dissolving the silicon compound in an organic solvent to the base resin layer, and implanting ions into the resulting film using a plasma ion implantation method; or the like.

Examples of the ions that are implanted using the plasma ion implantation method include ions of a rare gas (e.g., argon, helium, neon, krypton, and xenon), a fluorocarbon, hydrogen, nitrogen, oxygen, carbon dioxide, chlorine, fluorine, sulfur, and the like; ions of a metal (e.g., gold, silver, copper, platinum, nickel, palladium, chromium, titanium, molybdenum, niobium, tantalum, tungsten, and aluminum); and the like.

The thickness of the gas barrier layer is preferably 1 nm to 10 μm, more preferably 10 to 1,000 nm, still more preferably 20 to 500 nm, and particularly preferably 50 to 300 nm.

The gas barrier layer may include a single layer, or may be a laminate in which a plurality of layers are stacked.

The water vapor transmission rate of the gas barrier film at a temperature of 40° C. and a relative humidity of 90% is preferably 10 g/(m$^2$·day) or less, more preferably 1 g/(m$^2$·day) or less, still more preferably 0.1 g/(m$^2$·day) or less, and particularly preferably 0.01 g/(m$^2$·day) or less.

The water vapor transmission rate of the gas barrier film may be measured using the method described above.

The sealing sheet according to one embodiment of the invention may have a structure in which the gas barrier layer is provided on the side of the base resin layer opposite to the side on which the microstructure is provided, or may have a structure in which the gas barrier layer is provided on the side of the base resin layer on which the microstructure is provided.

(4) Sealing Sheet

The sealing sheet according to one embodiment of the invention includes at least the base resin layer and the sealing resin layer, the base resin layer having the microstructure that is provided to one surface of the base resin layer.

Figure 7:
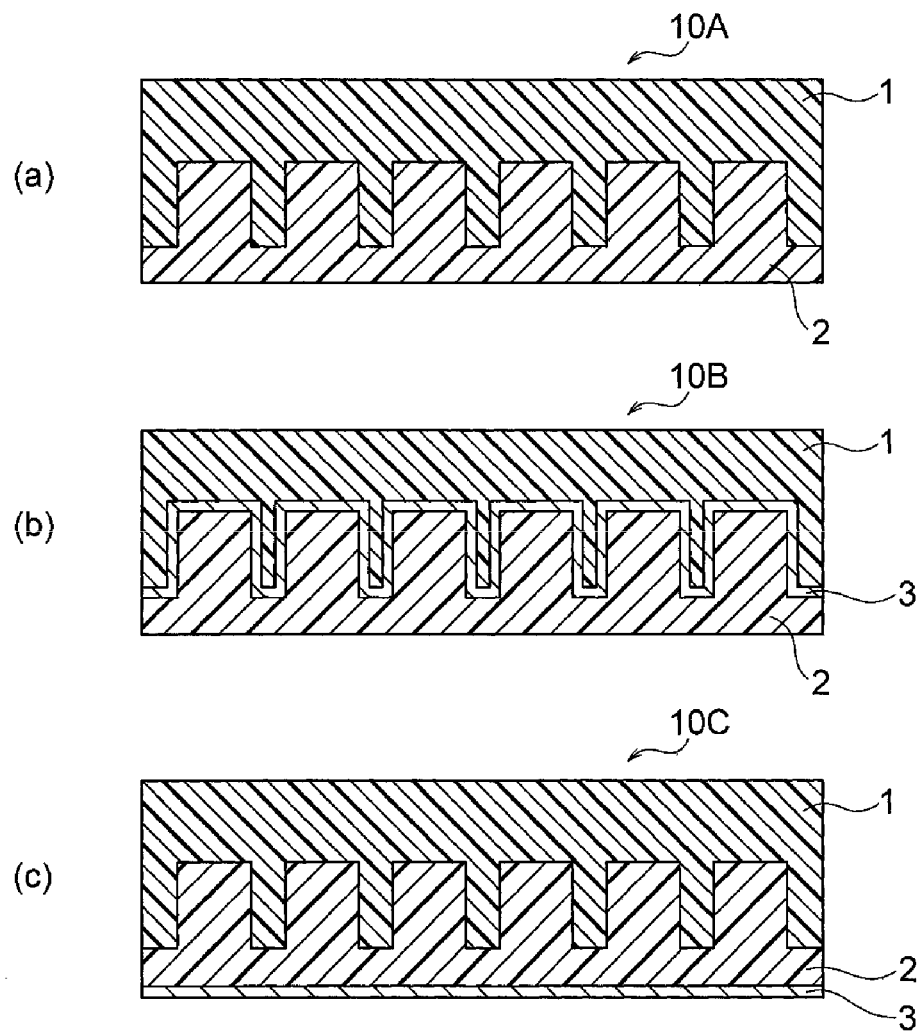
FIG. 7 is a view illustrating an example of the layer configuration of a sealing sheet according to one embodiment of the invention.

The sealing sheet according to one embodiment of the invention may have a layer configuration among the layer configurations illustrated in FIG. 7, for example. In FIG. 7, reference sign 1 indicates the sealing resin layer, reference sign 2 indicates the base resin layer, and reference sign 3 indicates the gas barrier layer.

(a) in FIG. 7 illustrates a sealing sheet (10A) that has a layer configuration consisting of "base resin layer 2/sealing resin layer 1", (b) in FIG. 7 illustrates a sealing sheet (10B) that has a layer configuration consisting of "base resin layer 2/gas barrier layer 3/sealing resin layer 1", and (c) in FIG. 7 illustrates a sealing sheet (10C) that has a layer configuration consisting of "gas barrier layer 3/base resin layer 2/sealing resin layer 1".

When the sealing sheet according to one embodiment of the invention is the sealing sheet (10C), the water vapor transmission rate of the base resin layer 2 measured at a temperature of 40° C. and a relative humidity of 90% must be lower than that of the sealing resin layer 1, in order to obtain the advantageous effects of the invention.

Among these, the sealing sheet (10B) and the sealing sheet (10C) are preferable, and the sealing sheet (10B) is more preferable, from the viewpoint of gas barrier capability.

The sealing sheet may include a release sheet that is provided on each side or one side of the sealing sheet so as to define the outermost surface.

Production of Sealing Sheet

The sealing sheet may be produced using an arbitrary method. For example, the sealing sheet (10A) may be produced as described below.

The base resin layer 2 (base resin film or base resin sheet) having a microstructure that is provided to (formed on) the surface of the polymer, is provided.

Separately, the sealing resin sheet provided with a release sheet (in which the sealing resin layer 1 is formed on the release sheet), is provided.

The sealing resin layer 1 included in the sealing resin sheet provided with a release sheet is bonded to the side of the base resin layer 2 on which the microstructure is provided (formed) to obtain the sealing sheet (10A) provided with a release sheet.

The sealing resin layer 1 may be bonded to the base resin layer 2 using a laminator (hereinafter the same).

The sealing sheet (10B) may be produced as described below, for example.

The gas barrier layer 3 is formed on the side of the base resin layer 2 on which the microstructure is provided (formed) using the method described above, for example, to obtain a base resin layer provided with a gas barrier layer. The gas barrier layer 3 included in the base resin layer provided with a gas barrier layer is bonded to the sealing resin layer 1 included in a sealing resin sheet provided with a release sheet (that is provided separately) to obtain the sealing sheet (10B) provided with a release sheet.

The sealing sheet (10C) may be produced as described below, for example.

The base resin layer 2 having a microstructure that is provided to (formed on) the surface of the polymer, is provided. The gas barrier layer 3 is formed on the side of the base resin layer 2 opposite to the side on which the microstructure is provided (formed).

The gas barrier layer 3 may be formed using a method that forms a gas barrier layer directly on the side of the base resin layer 2 opposite to the side on which the microstructure is provided (formed); a method that provides a gas barrier sheet provided with a release sheet (in which the gas barrier layer 3 is formed on the surface of the release sheet), bonds the gas barrier layer 3 included in the gas barrier sheet to the side of the base resin layer 2 opposite to the side on which the microstructure is provided (formed), and removes the release sheet; or the like.

The side of the base resin layer 2 on which the microstructure is provided (formed), is bonded to the sealing resin layer 1 included in the sealing resin sheet provided with a release sheet to obtain the sealing sheet (10C) provided with a release sheet.

The sealing sheet according to one embodiment of the invention exhibits an excellent gas barrier capability that suppresses or reduces the entry of a gas (e.g., water vapor) not only in the vertical direction, but also in the horizontal direction (from the edge) with respect to the sealing sheet.

This is evident from that fact that the sealing sheet according to one embodiment of the invention is evaluated as "A" or "B" when subjected to the water entry test described later (see the examples), for example.

Therefore, the sealing sheet according to one embodiment of the invention ensures excellent long-term reliability when applied to an organic EL display, a high-definition color liquid crystal display, and the like for which a high barrier capability is particularly required.

2) Electronic Device Member and Electronic Device

An electronic device member according to one embodiment of the invention includes the sealing sheet according to one embodiment of the invention. The sealing sheet according to one embodiment of the invention exhibits an excellent gas barrier capability (sealing capability) that suppresses or reduces the entry of a gas (e.g., water vapor) not only in the vertical direction, but also in the horizontal direction (from the edge) with respect to the sealing sheet. Therefore, the electronic device member according to one embodiment of the invention is suitable as an electronic device member that is used for a display (e.g., liquid crystal display and EL display), a solar cell, and the like, for example.

An electronic device according to one embodiment of the invention includes the electronic device member according to one embodiment of the invention. Examples of the electronic device include, but are not limited to, a display device module that includes a liquid crystal element, an LED element, an organic EL element, or the like as an electronic element; an electronic paper that includes an electrophoretic element, an electronic powder element, a cholesteric liquid crystal element, or the like as an electronic element; a solar cell module that includes a solar cell as an electronic element; and the like.

Figure 8:
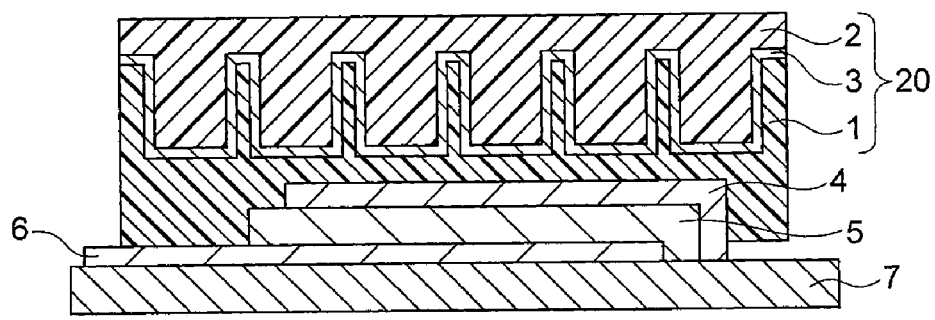
FIG. 8 is a view illustrating a configuration example of an organic EL device according to one embodiment of the invention.

FIG. 8 illustrates an organic EL device that is an example of the electronic device according to one embodiment of the invention.

As illustrated in FIG. 8, the organic EL device includes a transparent electrode 6 that is formed on a substrate 7; an organic EL element (hole-transporting layer and emitting layer) 5 and a bottom electrode 4 that are stacked on the transparent electrode 6; and a sealing sheet 20 that seals the organic EL element 5 and the like.

Since the organic EL device illustrated in FIG. 8 includes the sealing sheet according to one embodiment of the invention as the sealing sheet that seals the organic EL element, water does not enter the organic EL element from the edge, and the emission properties of the organic EL element are not impaired, for example.

The electronic device according to one embodiment of the invention exhibits an excellent gas barrier capability and excellent long-term reliability when subjected to the organic EL element evaluation test and the like described later (see the examples).

EXAMPLES

The invention is further described below by way of examples. Note that the invention is not limited to the following examples.

Measurement of Water Vapor Transmission Rate

The water vapor transmission rate was measured at a temperature of 40° C. and a relative humidity of 90% using a water vapor transmission rate measurement apparatus ("L80-5000" manufactured by Lyssy).

The water vapor transmission rate of the sealing resin layer was measured using a water vapor transmission rate measurement sample prepared by sandwiching the sealing resin layer between two polyethylene terephthalate (PET) films (manufactured by Mitsubishi Plastics Inc., thickness: 6 μm).

Water Entry Test

A calcium layer having a length of 35 mm, a width of 35 mm, and a thickness of 100 nm was formed on an alkali-free glass substrate (manufactured by Corning, 45×45 mm) using a vacuum deposition method.

After removing the release sheet from the sealing sheet, the exposed sealing resin layer was bonded to the calcium layer formed on the glass substrate in a nitrogen atmosphere using a laminator to obtain a water entry test specimen in which the calcium layer was sealed.

The resulting specimen was allowed to stand for 170 hours at a temperature of 60° C. and a relative humidity of 90%, and the degree of discoloration of the calcium layer (i.e., the degree of entry of water (moisture)) was observed with the naked eye. The water barrier capability was evaluated in accordance with the following standard.

Evaluation Standard
A: Less than 20% (area ratio) of the calcium layer was discolored.
B: 20% or more and less than 30% (area ratio) of the calcium layer was discolored.
C: 30% or more and less than 50% (area ratio) of the calcium layer was discolored.
D: 50% or more (area ratio) of the calcium layer was discolored.

Example 1

The microstructure detailed below (i.e., the structure illustrated in FIG. 3 (see (d))) was formed on a base resin layer ("A4100" manufactured by Toyobo Co., Ltd., thickness: 50 μm) using a thermal imprint method to obtain a base resin layer 2A.

Microstructure
Maximum difference in height (H): 20 μm
Shape: Rounded rectangular shape
Radius of curvature: 3 mm
Cross section: Triangular shape (side length: 20 μm)
Pitch: 20 μm
Maximum side length: 45 mm
Cycle: 250 cycles inward from the circumference having the maximum side length A silicon oxynitride film (gas barrier layer) having a thickness of 200 nm was formed on the side of the base resin layer 2A on which the microstructure was formed, using a plasma-enhanced chemical vapor deposition method.

100 parts of a copolymer of isobutylene and isoprene ("ExxonButyl 268" manufactured by Japan Butyl Co., Ltd.), 20 parts of an aliphatic petroleum resin ("Quintone A100" manufactured by Zeon Corporation) (tackifier), and 1 part of an epoxy compound ("TC-5" manufactured by Mitsubishi Chemical Corporation) (crosslinking agent) were dissolved in toluene to obtain a sealing resin composition having a solid content of 25%.

The resulting sealing resin composition was applied to the release-treated surface of a release sheet ("SP-PET381130" manufactured by Lintec Corporation, thickness: 38 μm) so that the thickness after drying was 20 μm, and the resulting film was dried at 120° C. for 2 minutes to form a sealing resin layer. The release-treated surface of a release sheet ("SP-PET38T103-1" manufactured by Lintec Corporation, thickness: 38 μm) was bonded to the sealing resin layer to obtain a sealing resin layer 1A provided with a release sheet stacked on each side.

One of the release sheets was removed from the sealing resin layer 1A, and the exposed surface of the sealing resin layer 1A was bonded to the gas barrier layer formed on the base resin layer 2A using a laminator to obtain a sealing sheet (base resin layer 2A/gas barrier layer 3A/sealing resin layer 1A/release sheet) 1 provided with a release sheet.

The water vapor transmission rate of the base resin layer 2A and the water vapor transmission rate of the sealing resin layer 1A were measured, and found to be 9.0 g/(m²·day) and 7.2 g/(m²·day), respectively.

The sealing sheet 1 was subjected to the water entry test. The evaluation results are listed in Table 1.

Production of Electronic Device (Organic EL Element) 1

A glass substrate was sequentially subjected to a solvent cleaning treatment and a UV/ozone treatment, and aluminum (Al) (manufactured by Kojundo Chemical Lab. Co., Ltd.) (100 nm) was deposited on the surface of the glass substrate at a deposition rate of 0.1 nm/s to form a cathode (first electrode).

(8-Hydroxyquinolinato)lithium (manufactured by Luminescence Technology) (10 nm), 2,9-dimethyl-4,7-diphenyl-1,10-phenanthroline (manufactured by Luminescence Technology) (10 nm), tris(8-hydroxyquinolinato)aluminum (manufactured by Luminescence Technology) (40 nm), and N,N'-bis(naphthalen-1-yl)-N,N'-bis(phenyl)-benzidine (manufactured by Luminescence Technology) (60 nm) were sequentially deposited on the cathode (Al film) at a deposition rate of 0.1 to 0.2 nm/s to form an emitting layer (organic EL layer).

An indium tin oxide (ITO) film (thickness: 100 nm, sheet resistance: 50 Ω/sq) was formed on the emitting layer using a sputtering method to form an anode (second electrode). Note that the degree of vacuum during deposition and sputtering was set to 1×10$^{-4}$ Pa or less.

After removing the release sheet from the sealing sheet, the sealing sheet was heated (dried) at 120° C. for 10 minutes in a nitrogen atmosphere using a hot plate, and allowed to cool to room temperature.

The sealing sheet 1 was placed so as to cover the first electrode, the organic EL layer, and the second electrode formed on the glass substrate, and thermocompression-bonded thereto at 100° C. to seal the first electrode, the organic EL layer, and the second electrode to obtain a top-emission electronic device (organic EL element) 1.

The organic EL element 1 was evaluated as described below. The evaluation results are listed in Table 1.

Evaluation of Organic EL Element

The organic EL element 1 was allowed to stand for 200 hours at a temperature of 23° C. and a relative humidity of 50%, and driven to observe the presence or absence of a non-emitting area. The organic EL element 1 was evaluated in accordance with the following standard.

Evaluation Standard

A: A non-emitting area was not observed, or was observed in a ratio of less than 5% with respect to the initial emitting area.

B: A non-emitting area was observed in a ratio of 5% or more and less than 10% with respect to the initial emitting area.

C: A non-emitting area was observed in a ratio of 10% or more and less than 15% with respect to the initial emitting area.

D: A non-emitting area was observed in a ratio of 15% or more with respect to the initial emitting area.

Example 2

A sealing sheet 2 provided with a release sheet was produced in the same manner as in Example 1, except that the sealing resin layer was formed so that the thickness after drying was 30 μm, and subjected to the water entry test. The water vapor transmission rate of the sealing resin layer was 6.0 g/(m$^2$·day).

An organic EL element 2 was produced in the same manner as in Example 1, except that the sealing sheet 2 was used, and evaluated in the same manner as in Example 1. The evaluation results are listed in Table 1.

Example 3

A sealing sheet 3 provided with a release sheet was produced in the same manner as in Example 1, except that the sealing resin layer was formed so that the thickness after drying was 59 μm, and subjected to the water entry test. The water vapor transmission rate of the sealing resin layer was 2.5 g/(m$^2$·day).

An organic EL element 3 was produced in the same manner as in Example 1, except that the sealing sheet 3 was used, and evaluated in the same manner as in Example 1. The evaluation results are listed in Table 1.

Example 4

A sealing sheet 4 provided with a release sheet was produced in the same manner as in Example 1, except that a base resin layer 2B (thickness: 50 μm) having the microstructure detailed below (i.e., the structure illustrated in FIG. 3 (see (b))) was used, and subjected to the water entry test. The water vapor transmission rate of the base resin layer 2B was 10 g/(m$^2$·day).

Microstructure

Maximum difference in height (H): 20 μm

Shape: Spiral shape

Cross section: Triangular shape (side length: 20 μm)

Maximum diameter: 63 mm

Pitch: 20 μm

Cycle: 1,500 cycles inward with respect to the maximum diameter (one cycle: a spiral up to a point shifted from the starting point by one pitch)

An organic EL element 4 was produced in the same manner as in Example 1, except that the sealing sheet 4 was used, and evaluated in the same manner as in Example 1. The evaluation results are listed in Table 1.

Example 5

A sealing sheet 5 provided with a release sheet was produced in the same manner as in Example 1, except that a base resin layer 2C (thickness: 50 μm) having the microstructure detailed below (i.e., the structure illustrated in FIG. 2 (see (a))) was used, and subjected to the water entry test. The water vapor transmission rate of the base resin layer 2C was 10 g/(m$^2$·day).

Microstructure

Maximum difference in height (H): 20 μm

Shape: Hexagonal pyramidal shape

Pitch: 20 μm

An organic EL element 5 was produced in the same manner as in Example 1, except that the sealing sheet 5 was used, and evaluated in the same manner as in Example 1. The evaluation results are listed in Table 1.

Example 6

A sealing sheet 6 provided with a release sheet was produced in the same manner as in Example 1, except that a base resin layer 2D (thickness: 50 μm) having the microstructure detailed below (i.e., the structure illustrated in FIG. 4 (see (b))) was used, and subjected to the water entry test. The water vapor transmission rate of the base resin layer 2D was 9.3 g/(m$^2$·day).

Microstructure

Maximum difference in height (H): 20 μm

Shape: Mesh-like shape (orthogonal-oblique mesh-like shape)

Cross section: Triangular shape (radius: 20 μm)

Pitch: The orthogonal lines were provided at a pitch of 100 μm, and the oblique lines were provided to pass through the intersections of the orthogonal lines.

An organic EL element 6 was produced in the same manner as in Example 1, except that the sealing sheet 6 was used, and evaluated in the same manner as in Example 1. The evaluation results are listed in Table 1.

Example 7

A sealing sheet 7 provided with a release sheet was produced in the same manner as in Example 1, except that a base resin layer 2E (thickness: 50 μm) having the microstructure detailed below (i.e., the structure illustrated in FIG. 4 (see (c))) was used, and the sealing resin layer was formed to have a thickness of 21 μm, and subjected to the water entry test. The water vapor transmission rate of the base resin layer 2E and the water vapor transmission rate of the sealing resin layer (1B) were 9.5 g/(m²·day) and 7 g/(m²·day), respectively.
Microstructure
Maximum difference in height (H): 20 μm
Shape: Mesh-like shape (wavy mesh-like shape)
Cross section: Trapezoidal shape (upper base: 10 μm, lower base: 20 μm (the gas barrier layer was formed on the upper base))
Pitch: 100 μm An organic EL element 7 was produced in the same manner as in Example 1, except that the sealing sheet 7 was used, and evaluated in the same manner as in Example 1. The evaluation results are listed in Table 1.

Example 8

A sealing sheet 8 provided with a release sheet was produced in the same manner as in Example 7, except that a base resin layer 2F (thickness: 50 μm) having the microstructure detailed below (i.e., the structure illustrated in FIG. 4 (see (c))) was used, and subjected to the water entry test. The water vapor transmission rate of the base resin layer 2F was 9.5 g/(m²·day).
Microstructure
Maximum difference in height (H): 20 μm
Shape: Mesh-like shape (wavy mesh-like shape)
Cross section: Semicircular shape (radius: 20 μm)
Pitch: 100 μm An organic EL element 8 was produced in the same manner as in Example 1, except that the sealing sheet 8 was used, and evaluated in the same manner as in Example 1. The evaluation results are listed in Table 1.

Example 9

A sealing sheet 9 provided with a release sheet was produced in the same manner as in Example 1, except that a base resin layer 2G (thickness: 50 μm) having the microstructure detailed below (i.e., the structure illustrated in FIG. 4 (see (c))) was used, and subjected to the water entry test. The water vapor transmission rate of the base resin layer 2G was 9.5 g/(m²·day).
Microstructure
Maximum difference in height (H): 20 μm
Shape: Mesh-like shape (wavy mesh-like shape)
Cross section: Triangular shape (side length: 20 μm)
Pitch: 100 μm An organic EL element 9 was produced in the same manner as in Example 1, except that the sealing sheet 9 was used, and evaluated in the same manner as in Example 1. The evaluation results are listed in Table 1.

Example 10

A silicon oxide film (gas barrier layer) having a thickness of 100 nm was formed on the side of the base resin layer 2A (thickness: 50 μm) opposite to the side on which the microstructure was formed, using a plasma-enhanced chemical vapor deposition method.

A reactor was charged with 90 parts of butyl acrylate, 10 parts of acrylic acid, and 0.2 parts of azobisisobutyronitrile, which were mixed. The resulting mixture was deaerated by bubbling nitrogen gas for 4 hours, and heated to 60° C. with stirring. The mixture was stirred at 60° C. for 24 hours to effect a polymerization reaction. The reaction mixture was diluted with ethyl acetate to obtain a solution of an acrylic-based copolymer (weight average molecular weight: 650,000) in ethyl acetate (solid content: 33%).

After the addition of a polyisocyanate compound ("CORONATE L" manufactured by Nippon Polyurethane Industry Co., Ltd.) so that the amount of solid was 1.5 parts based on 100 parts of the solid included in the solution of the acrylic-based copolymer in ethyl acetate, toluene was added to the mixture to obtain a sealing resin composition having a solid content of 20%.

The resulting sealing resin composition was applied to the release-treated surface of a release sheet ("SP-PET381130" manufactured by Lintec Corporation, thickness: 38 μm) so that the thickness after drying was 21 μm, and the resulting film was dried at 120° C. for 2 minutes to form a sealing resin layer 1C. A sealing sheet 10 provided with a release sheet was produced in the same manner as in Example 1, except that the sealing resin layer 1C was used, and subjected to the water entry test. The water vapor transmission rate of the sealing resin layer 1C was 95 g/(m²·day).

An organic EL element 10 was produced in the same manner as in Example 1, except that the sealing sheet 10 was used, and evaluated in the same manner as in Example 1. The evaluation results are listed in Table 1.

Example 11

A sealing sheet 11 provided with a release sheet was produced in the same manner as in Example 10, except that the sealing resin layer was formed so that the thickness after drying was 59 μm, and subjected to the water entry test. The water vapor transmission rate of the sealing resin layer 1D was 32 g/(m²·day).

An organic EL element 11 was produced in the same manner as in Example 1, except that the sealing sheet 11 was used, and evaluated in the same manner as in Example 1. The evaluation results are listed in Table 1.

Comparative Example 1

A sealing sheet 1r provided with a release sheet was produced in the same manner as in Example 1, except that a base resin layer 2H (that was not provided with a microstructure) (PET film, "COSMOSHINE A4100" manufactured by Toyobo Co., Ltd., thickness: 50 μm) was used, and subjected to the water entry test. The water vapor transmission rate of the base resin layer 2H was 7 g/(m²·day).

An organic EL element 1r was produced in the same manner as in Example 1, except that the sealing sheet 1r was used, and evaluated in the same manner as in Example 1. The evaluation results are listed in Table 1.

Comparative Example 2

A sealing sheet 2r provided with a release sheet was produced in the same manner as in Example 1, except that the sealing resin layer was formed so that the thickness after drying was 19 μm, and subjected to the water entry test. The water vapor transmission rate of the sealing resin layer (1E) was 7.5 g/(m²·day).

An organic EL element 2r was produced in the same manner as in Example 1, except that the sealing sheet 2r was used, and evaluated in the same manner as in Example 1. The evaluation results are listed in Table 1.

Comparative Example 3

A sealing sheet 3r provided with a release sheet was produced in the same manner as in Example 1, except that the sealing resin layer was formed so that the thickness after drying was 60 μm, and subjected to the water entry test. The water vapor transmission rate of the sealing resin layer (1F) was 2.3 g/(m²·day).

An organic EL element 3r was produced in the same manner as in Example 1, except that the sealing sheet 3r was used, and evaluated in the same manner as in Example 1. The evaluation results are listed in Table 1.

Comparative Example 4

A sealing sheet 4r provided with a release sheet was produced in the same manner as in Example 10, except that the sealing resin layer was formed so that the thickness after drying was 19 μm, and subjected to the water entry test. The water vapor transmission rate of the sealing resin layer (1G) was 100 g/(m²·day).

An organic EL element 4r was produced in the same manner as in Example 1, except that the sealing sheet 4r was used, and evaluated in the same manner as in Example 1. The evaluation results are listed in Table 1.

Comparative Example 5

A sealing sheet 5r provided with a release sheet was produced in the same manner as in Example 10, except that the sealing resin layer was formed so that the thickness after drying was 60 μm, and subjected to the water entry test. The water vapor transmission rate of the sealing resin layer (1H) was 30 g/(m²·day). An organic EL element 5r was produced in the same manner as in Example 1, except that the sealing sheet 5r was used, and evaluated in the same manner as in Example 1. The evaluation results are listed in Table 1.

In Table 1, the configuration (b) refers to a configuration consisting of "base resin layer 2/gas barrier layer 3/sealing resin layer 1", and the configuration (c) refers to a configuration consisting of "gas barrier layer 3/base resin layer 2/sealing resin layer 1".

TABLE 1

| | Sealing sheet | | | | | | | | | |
|---|---|---|---|---|---|---|---|---|---|---|
| | | Base resin layer | | | | Sealing resin layer | | | | |
| | Configuration | Type | Microstructure | Maximum difference in height (H) (μm) | Water vapor transmission rate*1 | Thickness (h) (μm) | Water vapor transmission rate*1 | h/H | Water entry test | Organic EL evaluation |
| Example 1 | (b) | 2A | Provided | 20 | 9.0 | 20 | 7.2 | 1.0 | A | A |
| Example 2 | (b) | 2A | Provided | 20 | 9.0 | 30 | 6.0 | 1.5 | A | B |
| Example 3 | (b) | 2A | Provided | 20 | 9.0 | 59 | 2.5 | 2.95 | B | C |
| Example 4 | (b) | 2B | Provided | 20 | 10 | 20 | 7.2 | 1.0 | A | A |
| Example 5 | (b) | 2C | Provided | 20 | 10 | 20 | 7.2 | 1.0 | A | B |
| Example 6 | (b) | 2D | Provided | 20 | 9.3 | 20 | 7.2 | 1.0 | A | A |
| Example 7 | (b) | 2E | Provided | 20 | 9.5 | 21 | 7.0 | 1.05 | B | C |
| Example 8 | (b) | 2F | Provided | 20 | 9.5 | 21 | 7.0 | 1.05 | B | B |
| Example 9 | (b) | 2G | Provided | 20 | 9.5 | 20 | 7.2 | 1.0 | B | B |
| Example 10 | (c) | 2A | Provided | 20 | 9.0 | 21 | 95 | 1.05 | B | B |
| Example 11 | (c) | 2A | Provided | 20 | 9.0 | 59 | 32 | 2.95 | C | C |
| Comparative Example 1 | (b) | 2H | Not provided | — | 7.0 | 21 | 7.0 | — | D | D |
| Comparative Example 2 | (b) | 2A | Provided | 20 | 9.0 | 19 | 7.5 | 0.95 | D | D |
| Comparative Example 3 | (b) | 2A | Provided | 20 | 9.0 | 60 | 2.3 | 3.0 | C | D |
| Comparative Example 4 | (c) | 2A | Provided | 20 | 9.0 | 19 | 100 | 0.95 | D | D |
| Comparative Example 5 | (c) | 2A | Provided | 20 | 9.0 | 60 | 30 | 3.0 | D | D |

*1Unit of water vapor transmission rate: g/(m² · day)

As is clear from Table 1, the sealing sheets 1 to 11 obtained in Examples 1 to 11 exhibited excellent results when subjected to the water entry test and the organic EL element evaluation test as compared with the sealing sheets 1r to 5r obtained in Comparative Examples 1 to 5 in which the microstructure was not provided, or the ratio (h/H) of the thickness (h) of the sealing resin layer to the maximum difference in height (H) of the microstructure was not set to 1.0 or more and less than 3.0.

REFERENCE SIGNS LIST

1 Sealing resin layer
2 Base resin layer
3 Gas barrier layer
4 Bottom electrode

5 Organic EL element
6 Transparent electrode
7 Substrate
10A, 10B, 10C, 20 Sealing sheet
H Maximum difference in height
h Thickness of sealing resin layer

The invention claimed is:

1. A sealing sheet comprising at least a base resin layer and a sealing resin layer,
the base resin layer having a microstructure that is provided to one surface of the base resin layer,
the sealing resin layer being provided on a side of the base resin layer on which the microstructure is provided,
the microstructure having a protrusion that has a maximum difference in height (H) of 1 to 50 µm and is arranged two-dimensionally on the surface of the base resin layer, and
a ratio (h/H) of a thickness (h) of the sealing resin layer to the maximum difference in height (H) of the microstructure being 1.0 or more and less than 3.

2. The sealing sheet according to claim 1, wherein a ratio (h/H) of a thickness (h) of the sealing resin layer to the maximum difference in height (H) of the microstructure is 1.0 or more and less than 2.

3. The sealing sheet according to claim 1, wherein a thickness (h) of the sealing resin layer is 1.0 to 100 µm.

4. The sealing sheet according to claim 1, wherein the microstructure has (i) a configuration in which a plurality of the protrusions are arranged on the surface of the base resin layer either regularly or irregularly at a nanometer pitch, (ii) a configuration in which the protrusion that is formed in a shape of a rail is arranged on the surface of the base resin layer either regularly or irregularly, or (iii) a combination thereof.

5. The sealing sheet according to claim 4, wherein the protrusion has a shape selected from a pyramidal shape, a conical shape, and a tapered shape.

6. The sealing sheet according to claim 4, wherein the microstructure has a configuration in which the protrusion that is formed in a shape of a rail is provided at least at an edge of the surface of the base resin layer.

7. The sealing sheet according to claim 4, wherein the microstructure has a configuration in which the protrusion that is formed in a shape of a rail is two-dimensionally arranged on the surface of the base resin layer so as to have a circular shape, a spiral shape, a rectangular shape, a rounded rectangular shape, a grid-like shape, an orthogonal-oblique grid-like shape, or a wavy grid-like shape.

8. The sealing sheet according to claim 1, wherein the protrusion has a quadrangular, triangular, or semicircular cross-sectional shape.

9. The sealing sheet according to claim 1, wherein the microstructure is formed by embossing.

10. The sealing sheet according to claim 1, wherein the sealing resin layer is a layer formed using a resin composition that comprises a rubber-based resin.

11. The sealing sheet according to claim 10, wherein the rubber-based resin is a polyisobutylene-based resin.

12. The sealing sheet according to claim 1, wherein the sealing resin layer is a layer formed using a sealing resin composition that comprises a rubber-based resin and a tackifier.

13. The sealing sheet according to claim 1, wherein the sealing resin layer is formed contiguous to the base resin layer.

14. The sealing sheet according to claim 1, further comprising a gas barrier layer.

15. The sealing sheet according to claim 14, the sealing sheet being a laminate in which the gas barrier layer, the base resin layer, and the sealing resin layer are stacked in this order.

16. The sealing sheet according to claim 15, wherein a water vapor transmission rate of the base resin layer measured at a temperature of 40° C. and a relative humidity of 90% is lower than that of the sealing resin layer.

17. The sealing sheet according to claim 14, the sealing sheet being a laminate in which the base resin layer, the gas barrier layer, and the sealing resin layer are stacked in this order.

18. An electronic device member comprising the sealing sheet according to claim 1.

19. An electronic device comprising the electronic device member according to claim 18.

* * * * *